United States Patent
Shi et al.

[11] Patent Number: 6,081,445
[45] Date of Patent: Jun. 27, 2000

[54] METHOD TO WRITE/READ MRAM ARRAYS

[75] Inventors: Jing Shi; Theodore Zhu, both of Chandler, Ariz.

[73] Assignee: Motorola, Inc., Schaumburg, Ill.

[21] Appl. No.: 09/122,722

[22] Filed: Jul. 27, 1998

[51] Int. Cl.[7] .................................................. G11C 11/00
[52] U.S. Cl. ......................... 365/158; 365/158; 365/173
[58] Field of Search ...................................... 365/158, 173

[56] References Cited

U.S. PATENT DOCUMENTS

| | | | |
|---|---|---|---|
| 4,356,523 | 10/1982 | Yeh | 360/113 |
| 5,159,513 | 10/1992 | Dieny et al. | 360/113 |
| 5,343,422 | 8/1994 | Kung et al. | 365/173 |

*Primary Examiner*—David Nelms
*Assistant Examiner*—Connie Yoha
*Attorney, Agent, or Firm*—Eugene A. Parsons; William E. Koch

[57] ABSTRACT

A method of writing/reading an array of magnetoresistive cells, with each cell in the array having associated therewith a first current line that generates an easy axis field and a second orthogonal current line that generates a hard axis field when current is applied thereto. The method includes initially applying a current to the second orthogonal current lines in a first direction that generates a hard axis field to switch end domains in all cells in the array to a fixed direction, and selecting a cell in the array for write/read using a half-select technique including supplying a half-select current to the first current line associated with the selected cell to generate a half-select easy axis field and, simultaneously, supplying a half-select current in the first direction to the second current line associated with the selected cell to generate a half-select hard axis field.

13 Claims, 1 Drawing Sheet

METHOD TO WRITE/READ MRAM ARRAYS

FIELD OF THE INVENTION

The present invention pertains to arrays of magnetoresistive memory cells and more specifically to an improved method of writing/reading high density arrays of memory cells.

BACKGROUND OF THE INVENTION

A magnetic random access memory (MRAM) is a non-volatile memory which basically includes a magnetoresistive (MR) material, a sense line, and a word line. The MRAM employs the MR effect to store memory states. Magnetic vectors in one or all of the layers of MR material are switched very quickly from one direction to an opposite direction when a magnetic field is applied to the MR material over a certain threshold. According to the direction of the magnetic vectors in the MR material, states are stored, for example, one direction can be defined as a logic "0", and another direction can be defined as a logic "1". The MR material maintains these states even without a magnetic field being applied. The states stored in the MR material can be read by passing a sense current through the cell in a sence line because of the difference between the magnetic resistances of the two states.

To be useful in present day electronic devices, very high density arrays of magnetic memory cells are utilized in magnetic random access memories. In these high density arrays the cells are generally arranged in rows and columns, with individual cells being addressable for reading and writing operations by the selection of an appropriate row and column containing the desired cell. Also, orthogonal current lines are provided, one for each row and one for each column so that a selected cell is written by applying current to the appropriate row current line and the appropriate column current line. The problem that arises is that current applied to the row and column current lines for writing and/or reading a selected cell can effect the data stored in other cells which are not at the cross-over point.

Accordingly, it is highly desirable to provide methods of writing/reading magnetic random access memories which do not effect other cells in the memories.

It is a purpose of the present invention to provide a new and improved method of writing/reading magnetic random access memories, or arrays of magnetic memories, which does not adversely effect other cells in the memory or array.

It is another purpose of the present invention to provide a new and improved method of writing/reading magnetic random access memories, or arrays of magnetic memories, which has better selectivity and reproducibility.

It is a further purpose of the present invention to provide a new and improved method of writing/reading magnetic random access memories, or arrays of magnetic memories, which has more stable switching.

SUMMARY OF THE INVENTION

The above problems and others are at least partially solved and the above purposes and others are realized in a method of writing/reading arrays of magnetoresistive cells each having an easy and hard magnetization axis, with each cell in the array having associated therewith a first current line that generates an easy axis field and a second orthogonal current line that generates a hard axis field when current is applied thereto. The method includes applying a current to the second orthogonal current line in a first direction that generates a hard axis field to maintain end domains in all cells under the second orthogonal current line to a fixed direction. The end domains in all cells in the array are set into a predetermined direction initially. Specific cells in the array are then addressed for writing/reading by selecting a cell in the array using a magnetic field generated by two orthogonal lines including supplying a current to the first current line associated with the selected cell to generate an easy axis field, preferably about one half of the total field required to switch the magnetic layer, and, simultaneously, supplying a current in the first direction to the second current line associated with the selected cell to generate a hard axis field, preferably, one half of the magnetic field required to write the bit.

BRIEF DESCRIPTION OF THE DRAWINGS

Referring to the drawings.

DESCRIPTION OF THE PREFERRED EMBODIMENT

Figure 1:
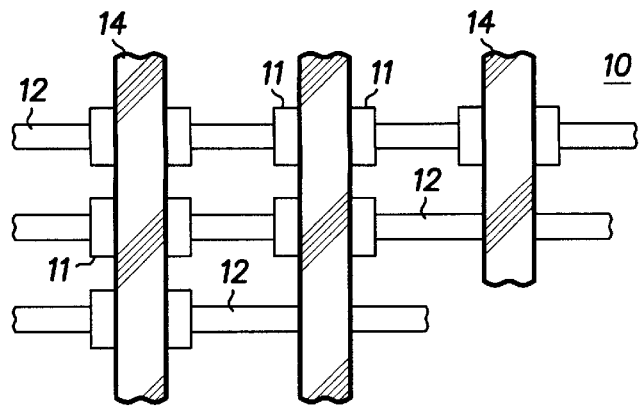
FIG. 1 is a simplified view in top plan of an array of magnetic memory cell.

Turning now to the drawings, FIG. 1 is a simplified view in top plan of an array 10 of magnetic memory cell 11. Generally cells 11 are formed and supported on a substrate, which may be, for example, a semiconductor substrate, or the like. Also, cells 11 are generally arranged into rows and columns, or some similar arrangement, with each row having a current line 12 associated therewith and each column having a current line 14 associated therewith. Further, cells 11 are arranged with a long axis extending parallel to the rows and a transverse axis extending parallel to the columns. As will be explained in more detail below, each cell 11 has an easy axis of magnetization 19 directed parallel with the long axis (length) of the cell and a hard axis of magnetization 20 directed parallel with the short axis (width) of the cell. Thus, each cell 11 in array 10 has associated therewith a current line 14 that generates an easy axis field and an orthogonal current line 12 that generates a hard axis field when current is applied thereto.

Figure 2:
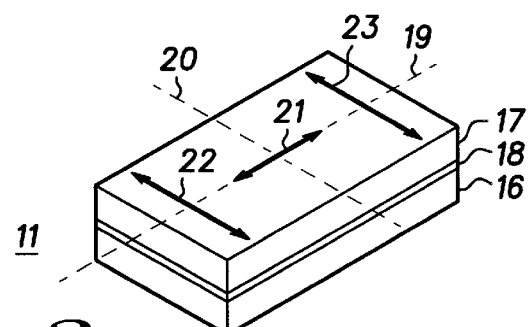
FIG. 2 is a simplified view of a single magnetic memory cell from the array of FIG. 1 illustrating magnetization and magnetization axes.

Turning now to FIG. 2, which is an enlarged isometric view of a single magnetic memory cell 11, from array 10, having multiple layers of magnetoresistive material. Cell 11 includes, for example, a first magnetic layer 16 and a second magnetic layer 17, which are separated by a first conducting or insulating spacer layer 18. Magnetic layers 16 and 17 each can be single layers of ferromagnetic materials such as a layer of nickel, iron, cobalt, or alloys thereof. Alternatively, either of layers 16 and 17 can be a composite ferromagnetic layer, such as a layer of nickel-iron-cobalt covering a layer of cobalt-iron or three layer structures including layers of cobalt-iron and nickel-iron-cobalt and cobalt-iron with cobalt-iron at the interface with adjacent layers. Materials that are suitable for layer 18 include most conductive materials such as Cu, Ag, Au, Cr and their alloys, or most non-conductive materials such as oxides, nitrides, dielectrics, etc. Although shown having two magnetic layers in this embodiment, cell 11 can have more than two magnetic layers depending upon the application and specific embodiment.

Generally, layers 16 and 17 are rectangular and each have a magnetization vector 21 that is positioned substantially along the length of the cell and maintained parallel to the length by the physical anisotropy. Here it should be understood that the term "rectangular" is defined to include all shapes in which the hard axis magnetic loop is not ideal, i.e. end domains play a role in switching. One way to achieve the positioning of the magnetization vector along the length, is to form the width smaller than the width of the magnetic domain walls or transition width within layers 16 and 17. Typically, widths of less than 1.0 to 1.2 microns result in such a constraint. Generally, to achieve high density the width is less than one micron and is as small as can be made by manufacturing technology, and the length is greater than the width. Also, the thicknesses of layers 16 and 17 are approximately three to ten nanometers and the thicknesses may be different in some embodiments. The difference in thicknesses of layers 16 and 17 affect the switching points and are utilized in some structures for reading and writing cells.

As illustrated in FIG. 2, a vector 21 is depicted with an arrowhead at each end to represent two different states of magnetization within cell 11. As will be understood by those skilled in the art, the magnetization in one of layers 16 or 17 is generally fixed and the other is free to rotate into either of the two positions represented by vector 21. One state is referred to as a logic "0" and the other state is a logic "1". While it will be understood by those skilled in the art that any logic definition can be assigned to either state, in this example when vector 21 points to the left in FIG. 1, cell 11 is in a logic "0" state and when vector 21 is in the opposite direction cell 11 is in a logic "1" state.

In a tunneling junction type of magnetic cell, layer 18 is an insulating layer, the provision of which between ferromagnetic layers 16 and 17 produces a tunneling junction that allows a flow of current perpendicularly through layer 18, from layer 16 to layer 17 (or vice versa). Essentially, cell 11 appears as a relatively high impedance (referred to herein as a resistance R). When the magnetization vectors in layers 16 and 17 are antiparallel the resistance R of cell 11 remains very high. When the magnetization vectors in layers 16 and 17 are parallel, the resistance R of cell 11 drops perceptibly. For a tunneling junction type of cell vector 21 of FIG. 2 represents one of parallel and antiparallel positions when it points left and the other of parallel and antiparallel when it points right.

Magnetic vector 21 represents the major portion of the magnetic domain or domains in cell 11. However, because the ends of layer 16 and 17 form a discontinuity in the magnetic domains, very high fields and magnetic poles are formed at the discontinuity or ends of layers 16 and 17. Discontinuities are not present along the sides of layers 16 and 17 since magnetic vector 21 is substantially parallel to the sides. The high fields at the ends of layers 16 and 17 cause magnetic vectors adjacent the ends, which are defined as minor magnetic end domains, and which attempt to form a closed magnetic loop at the ends. While these minor magnetic end domains are illustrated herein as a single magnetic end vector 22 at the left end and a single magnetic end vector 23 at the right end, for simplicity, it should be understood that each is composed of one or more smaller magnetic end vectors pointing in different directions. Also, for purposes of this disclosure the term "ends" will generally be defined to mean an area the width "W" of layers 16 and 17 and with a length equal to or less than the distance "W" from the physical end of layers 16 and 17.

The problem that minor magnetic end vectors 22 and 23 present is that they are haphazardly positioned, generally approximately parallel to the discontinuities or ends of layers 16 and 17. For example, both magnetic end vectors 22 and 23 can be oriented upwardly, end vector 22 can be oriented upwardly while end vector 23 is oriented downwardly, end vector 22 can be oriented downwardly while end vector 23 is oriented upwardly, both end vectors 22 and 23 can be oriented downwardly, etc. In reality, since each of end vectors 22 and 23 may represent several minor magnetic end vectors, there may be a great many more possible orientations.

Each time magnetic vector 21 is switched, magnetic end vectors 22 and 23 can change position, or not, depending upon the magnetic field applied, the material, the previous position, etc. The problem is that each of the various possible positions of end vectors 22 and 23 result in changes of the resistance of layers 16 and/or 17, when used in magnetic memory cell 11, as well as requiring different switching fields to produce switching in cell 11. That is, since each set of magnetic vectors 21, 22, and 23 require a certain magnitude of magnetic field to switch direction and since either or both of magnetic end vectors 22 and 23 may switch directions with magnetic vector 21, the magnitude of the magnetic field required to switch magnetic vector 21 may vary each time it is switched. The variation in resistance can be sufficient to cause problems in the reading or sensing of stored states in a magnetic memory cell and the variations in magnitude of the magnetic field required to switch states in the cell can cause switching problems, especially in large arrays, and will certainly use additional power, which can become substantial in large arrays.

Figure 3:
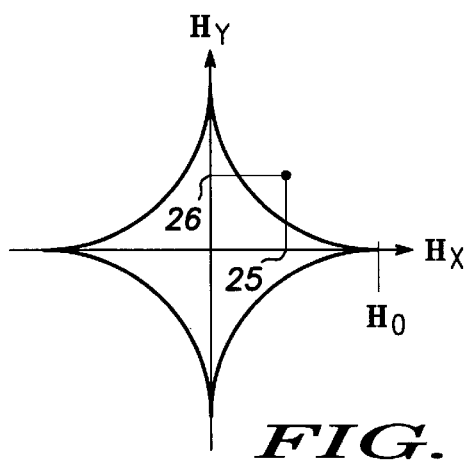
FIG. 3 is a graph illustrating the half-select technique of writing/reading the cell illustrated in FIG. 2.

Referring specifically to FIG. 3, a graph is illustrated depicting the half-select technique of writing/reading the cell illustrated in FIG. 2. The term "half-select" generally refers to the fact that approximately one half of the field required to switch the cell is generated by a current supplied to one of the current lines 12/14 and approximately one half of the field required to switch the cell is generated by a current supplied to the other of the current lines 12/14. Thus, only the addressed cell has the full switching field applied while the remaining cells in the energized row and column only have one half of the magnetic field required for switching. As can be seen in FIG. 3, the amount of magnetic field required to switch vector 21 of cell 11 is designated Ho. However, by supplying only sufficient current to the appropriate current line 14 to produce approximately one half of this magnetic field, designated by point 25 on the Hx (easy) axis, and by simultaneously supplying sufficient current to the appropriate current line 12 to produce approximately another half of this magnetic field, designated by point 26 on the Hy (hard) axis, vector 21 (and cell 11) is conveniently switched without switching any other cells in the array. It should be understood by those skilled in the art that the term "half" is used only to designate a general area and any combination of easy and hard axis fields that switches the selected cell without switching other cells is considered within the purview of this invention.

Figure 5:
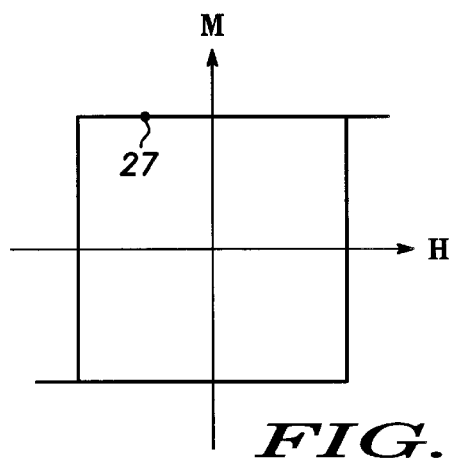
FIG. 5 is a graph illustrating the theoretical easy axis magnetization loop of the cell of FIG. 2.
Figure 4:
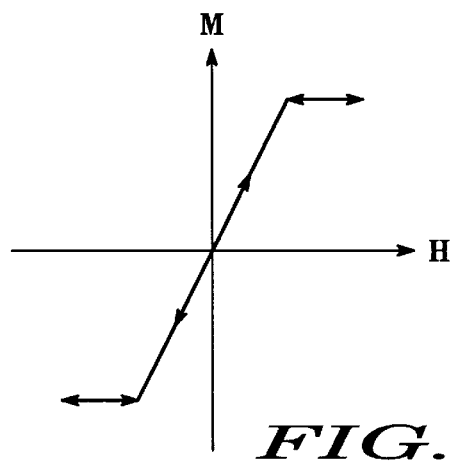
FIG. 4 is a graph illustrating the theoretical hard axis magnetization loop of the cell of FIG. 2.

The half-select method is based on the assumption that the cells are single domains. That is: the hard axis loop, as seen in FIG. 4, is purely due to magnetization rotation, and it is reversible. Therefore, other cells under the hard axis field alone (cells in the same row) will return to the original state after the field is removed (i.e. current is no longer applied to the selected current line 12). Also, other cells under the easy axis field alone (cells in the same row) will return to their original state as well, since the easy axis field will only move the magnetization to a point designated 27 on the easy axis loop, as seen in FIG. 5.

Figure 6:
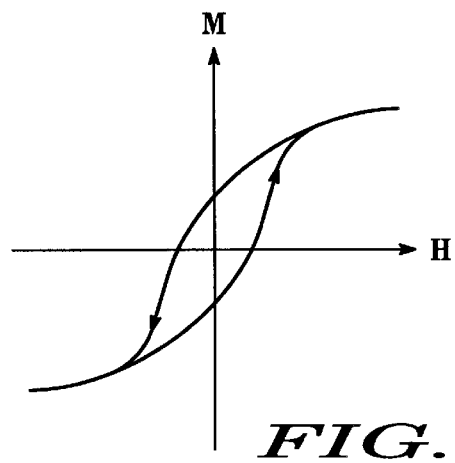
FIG. 6 is a graph illustrating the actual hard axis magnetization loop of the cell of FIG. 2.

However, real structures are not perfect single domains. The easy and hard axes loops are not ideal. A more realistic hard axis loop is illustrated in FIG. 6. When a hard axis field is applied to a cell 11, there is a chance that one or both end domains 22 and/or 23 may get switched. Therefore, cells under the hard axis field (cells in the same row as the selected cell) will not go back to their original state. For the easy axis loop, seen in FIG. 5, the transition is caused by the whole cell 11 (vector 21) switching. Since the easy axis magnetization loop is relatively sharp, setting the easy axis half-select field below the switching field ensures no disturbance to unselected cells.

It should be clear from the above description that the hard axis field can produce unwanted disturbances in the various cells of the array. To overcome this problem, a hard axis field is applied which switches all end domains or vectors 22 and 23 in all cells 11 of array 10 to a fixed direction. While this initializing could be applied prior to each switching operation, it is preferred that the end domains be switched once initially for simplicity of operation. Also, while it is preferred that the initialization be accomplished by applying an initialization current to each current line 12 in a selected direction and prior to using array 10 in any operations. The initialization current should be high enough to produce a hard axis field which switches (or maintains) all end domains or vectors 22 and 23 in a common direction. It will of course be understood that the initializing hard axis field could also be produced by an external field applied to array 10 in a fixed direction and high enough to produce a hard axis field which switches (or maintains) all end domains or vectors 22 and 23 in a common direction.

Subsequent to the initialization of array 10, or at least the initialization of the row containing the selected cell, a cell 11 in array 10 is selected for write/read using the half-select technique, that is by supplying a half-select current to the current line 14 associated with the selected cell to generate a half-select easy axis field and, simultaneously, by supplying a half-select current to the orthogonal current line 12 associated with the selected cell to generate a half-select hard axis field. The feature which insures that the initialized cells under the selected current line 12 will not be disturbed, i.e. will return to their original state, is that the half-select current supplied to the orthogonal current line 12 is supplied in the same direction as the initializing current. Further, in each subsequent switching operation, the current supplied to the current lines 12 to produce the hard axis field is always applied in the same direction as the initializing current. Thus, the hard axis field will always be in a direction tending to maintain the end domains in the original (initialized) position and no switching of the end domains will occur.

Thus, a new and improved method to write/read high density magnetic random access memories is disclosed which does not adversely effect other cells in the memory or array. Also, the new and improved method of writing/reading magnetic random access memories, or arrays of magnetic memories, has better selectivity and reproducibility as well as more stable switching without increasing the complexity of either the method or cells.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of writing and/or reading arrays of magnetoresistive cells comprising the steps of:

providing an array of magnetoresistive cells each having an easy and hard magnetization axis and end domain magnetization, with each cell in the array having associated therewith a first current line that generates an easy axis field and a second orthogonal current line that generates a hard axis field when current is applied thereto;

applying an initializing hard axis field to the array in a first direction that switches or maintains end domain magnetization in all cells in a fixed direction; and selecting a cell in the array for writing including supplying a current to the first current line associated with the selected cell to generate an easy axis field and, simultaneously, supplying a current to the second current line associated with the selected cell to generate a hard axis field, the current being supplied to the second current line in a direction that produces a hard axis field in the first direction.

2. A method of writing and/or reading arrays of magnetoresistive cells as claimed in claim 1 wherein the step of providing the array of magnetoresistive cells includes providing an array of magnetoresistive cells with a rectangular shape having end domain magnetization that effects the hard magnetization axis.

3. A method of writing and/or reading arrays of magnetoresistive cells as claimed in claim 2 wherein the step of providing the array of magnetoresistive cells with the rectangular shape includes providing cells with an easy axis directed along a length of the cell and a hard axis directed transverse to the length.

4. A method of writing and/or reading arrays of magnetoresistive cells as claimed in claim 1 wherein the step of selecting a cell in the array for writing includes using a half select technique wherein a half select current is applied to the first and second current lines.

5. A method of writing and/or reading arrays of magnetoresistive cells as claimed in claim 1 wherein the step of applying an initializing hard axis field to the array includes one of applying an external hard axis field to the array and applying a current to the second orthogonal current lines in a first direction that generates a hard axis field.

6. A method of writing and/or reading arrays of magnetoresistive cells comprising the steps of:

providing an array of magnetoresistive cells each having an easy and hard magnetization axis, with each cell in the array having associated therewith a first current line that generates an easy axis field and a second orthogonal current line that generates a hard axis field when current is applied thereto;

applying a current to the second orthogonal current line in a first direction that generates a hard axis field to maintain end domain magnetization in all cells under the second orthogonal current line in a fixed direction; and selecting a cell in the array for writing including supplying a current to the first current line associated with the selected cell to generate an easy axis field and, simultaneously, supplying a current to the second current line associated with the selected cell to generate a hard axis field, the current being supplied to the second orthogonal current line in the first direction.

7. A method of writing and/or reading arrays of magnetoresistive cells as claimed in claim 6 wherein the step of providing the array of magnetoresistive cells includes providing an array of magnetoresistive cells with a rectangular shape having end domain magnetization that effects the hard magnetization axis.

8. A method of writing and/or reading arrays of magnetoresistive cells as claimed in claim 7 wherein the step of providing the array of magnetoresistive cells with the rectangular shape includes providing cells with an easy axis directed along a length of the cell and a hard axis directed transverse to the length.

9. A method of writing and/or reading arrays of magnetoresistive cells as claimed in claim 6 wherein the step of selecting a cell in the array for writing includes using a half select technique wherein a half select current is applied to the first and second current lines.

10. A method of writing and/or reading arrays of magnetoresistive cells comprising the steps of:

provcing an array of magnetoresistive cells with each cell including a plurality of rectangularly shaped magnetoresistive layers of material with end domains of magnetization, each cell having an easy magnetization axis directed along a length of the cell and a hard magnetization axis directed transverse to the length of the cell, each cell in the array having associated therewith a first current line that generates an easy axis field and a second orthogonal current line that generates a hard axis field when current is applied thereto;

initially applying a current to the second orthogonal current lines in a first direction that generates a hard axis field to maintain the end domains in all cells in the array in a fixed direction; and subsequently selecting a cell in the array for writing including supplying a current to the first current line associated with the selected cell to generate an easy axis field and, simultaneously, supplying a current to the second current line associated with the selected cell to generate a hard axis field, the current being supplied to the second orthogonal current line in the first direction.

11. A method of writing and/or reading arrays of magnetoresistive cells as claimed in claim 10 wherein the step of providing the array of magnetoresistive cells includes providing an array of magnetoresistive cells with a rectangular shape having end domain magnetization that effects the hard magnetization axis.

12. A method of writing and/or reading arrays of magnetoresistive cells as claimed in claim 11 wherein the step of providing the array of magnetoresistive cells with the rectangular shape includes providing cells with an easy axis directed along a length of the cell and a hard axis directed transverse to the length.

13. A method of writing and/or reading arrays of magnetoresistive cells as claimed in claim 10 wherein the step of selecting a cell in the array for writing includes using a half select technique wherein a half select current is applied to the first and second current lines.

* * * * *

UNITED STATES PATENT AND TRADEMARK OFFICE
CERTIFICATE OF CORRECTION

PATENT NO. : 6,081,445
DATED : July 27, 2000
INVENTOR(S) : Shi et al.

It is certified that error appears in the above-identified patent and that said Letters Patent is hereby corrected as shown below:

<u>Column 1,</u>
Line 2, after the Title, please add as a new first paragraph the following paragraph:
-- This invention was made with Government support under Agreement No. MDA972-96-3-0016 awarded by DARPA. The Government has certain rights in the invention. --

Signed and Sealed this

Nineteenth Day of August, 2003

JAMES E. ROGAN
*Director of the United States Patent and Trademark Office*